United States Patent [19]
Rooke et al.

[11] Patent Number: 5,808,471
[45] Date of Patent: Sep. 15, 1998

[54] METHOD AND SYSTEM FOR VERIFYING SOLENOID OPERATION

[75] Inventors: Alan Michael Rooke, Novi; David Andrew Franchock, Livonia; Stephen Michael Cicala, Dearborn Heights; Myron Ihor Senyk, Sterling Heights; Kyle Shawn Williams, Redford; Roberto Anthony Rossi, Warren; Christopher David Tebbe, Canton, all of Mich.

[73] Assignee: Ford Global Technologies, Inc., Dearborn, Mich.

[21] Appl. No.: 691,255

[22] Filed: Aug. 2, 1996

[51] Int. Cl.⁶ .................................................. G01R 31/00
[52] U.S. Cl. ........................... 324/546; 324/511; 324/418
[58] Field of Search ..................... 324/546, 418, 324/423, 207.16, 207.22, 500, 511, 537

[56] References Cited

U.S. PATENT DOCUMENTS

| | | | |
|---|---|---|---|
| 4,321,946 | 3/1982 | Paulos et al. | 137/554 |
| 4,481,473 | 11/1984 | Compton | 324/423 |
| 4,764,840 | 8/1988 | Petrie et al. | 361/154 |
| 4,814,937 | 3/1989 | Uota | 361/154 |
| 4,833,565 | 5/1989 | Bauer et al. | 361/154 |
| 4,953,056 | 8/1990 | Yakuwa et al. | 361/154 |
| 4,970,622 | 11/1990 | Büchl | 361/154 |
| 5,053,911 | 10/1991 | Kopec et al. | 361/154 |
| 5,196,983 | 3/1993 | Stumpf | 361/154 |
| 5,204,633 | 4/1993 | Ahladas et al. | 324/654 |
| 5,222,011 | 6/1993 | Braun | 361/154 |
| 5,241,218 | 8/1993 | Page | 307/104 |
| 5,243,296 | 9/1993 | Ando et al. | 324/546 |
| 5,293,551 | 3/1994 | Perkins et al. | 361/154 |
| 5,442,671 | 8/1995 | Wollschlager et al. | 377/55 |
| 5,548,210 | 8/1996 | Dittrich | 324/418 X |

*Primary Examiner*—Michael Brock
*Attorney, Agent, or Firm*—Allan J. Lippa; Roger L. May

[57] ABSTRACT

A method and system for detecting degraded operation of a solenoid. A current through the solenoid is sampled at predetermined time intervals within a predetermined time period. A maximum value of the sampled current is first detected. Next, a minimum value of the sampled current subsequent to the maximum value is detected. Finally, a predetermined increase in the sampled current from the minimum value is detected to verify operation of the solenoid.

12 Claims, 4 Drawing Sheets

METHOD AND SYSTEM FOR VERIFYING SOLENOID OPERATION

TECHNICAL FIELD

This invention relates to methods and systems for verifying proper operation of a solenoid.

BACKGROUND ART

Electrical solenoids form an integral part of many types of mechanical systems. The electric solenoid includes a field coil that develops a magnetic field in response to current flow through the coil. The magnetic field causes movement of an actuator positioned within the field coil that in turn is attached to a mechanical or hydraulic device such as a valve or gear. By activating a switching circuit, current flows through the field coil to develop the magnetic field and move the actuator. For example, in automotive applications, solenoids are often used to shift gears in the transmission or engage emission control subsystems. In industrial applications, the solenoid may be used to open and close valves in hydraulic lines.

As with most physical devices, solenoids are subject to degraded operation. In the prior art, the actuator sensing has been accomplished by pressure sensors, Hall-effect sensors and opto-electronic sensors. In the pressure sensor approach, the pressure sensor detects pressures on opposite sides of the valve. The prior art sensors may be less effective than desired in some situations.

The known prior art also includes a solenoid movement detector circuit as disclosed in U.S. Pat. No. 5,442,671 issued to Wollschlager et al. The current flowing through the field coil of the solenoid is converted to a voltage signal which is stored across a capacitor. A first peak value of the voltage signal is determined. After the first peak, a counter must count to a predetermined value during the low peak before the voltage signal returns to its first peak value. If the counter reaches at least the predetermined value before returning to its first peak value and counts back down to zero before reaching steady state within a predetermined amount of time, the solenoid is considered engaged. This method, however, employs slope detection, which is time-dependent and requires calibration for proper operation. A given calibration does not cover a wide range of waveform characteristics. Varying parameters which affect the slope include temperature, battery voltage, hydraulic fluid viscosity and pressure, solenoid properties (electrical and mechanical), production machining tolerances, etc. Furthermore, the method disclosed in Wollschlager et al. senses the rise in the voltage signal only after the voltage signal has exceeded the peak current value. This reduces the amount of signal available for detection purposes and increases the circuit's susceptibility to noise.

Thus, a need exists for a method and circuit for detecting the operation of a solenoid that is immune to noise and free from calibration for various applications or operating conditions. A need also exists for a method and circuit for detecting the operation of a solenoid that exhibits a slow rate of change.

DISCLOSURE OF THE INVENTION

It is thus a general object of the present invention to provide a method and system for verifying the operation of a solenoid.

In carrying out the above object and other objects, features and advantages, of the present invention, a method is provided for verifying the operation of a solenoid. The method includes the step of sampling an output signal of the solenoid at predetermined time intervals. The method also includes the step of detecting a maximum value of the sampled output signal. Still further, the method includes the step of detecting a minimum value of the sampled output signal subsequent to the detection of the maximum value. Finally, the method includes the step of detecting a predetermined increase in the sampled output signal from the detected minimum value to indicate operation of the solenoid.

In further carrying out the above objects and other objects, features and advantages, of the present invention, a system is also provided for carrying out the steps of the above described method. The system includes means for sampling an output signal of the solenoid at predetermined time intervals. The system also includes means for detecting a maximum value of the sampled output signal. Still further, the system includes means for detecting a minimum value of the sampled output signal subsequent to the detection of the maximum value. Finally, the system includes means for detecting a predetermined increase in the sampled output signal from the detected minimum value to indicate operation of the solenoid.

The present invention provides the advantage of avoiding noise and calibration for various applications and operating conditions. The present invention also provides the advantage of detecting operation of a solenoid that exhibits a slow rate of change.

The above objects and other objects, features and advantages of the present invention are readily apparent from the following detailed description of the best mode for carrying out the invention when taken in connection with the accompanying drawings.

BEST MODES FOR CARRYING OUT THE INVENTION

In many applications, it is important to monitor operation of a solenoid. For example, the computer control system in an automobile needs to know when the transmission shifts gears in order to adjust fuel supply and engine RPMs. When a solenoid is commanded on, the current through the solenoid starts at zero and then exponentially increases. In a low-sided driver configuration, the voltage starts at battery voltage and immediately drops to a value near ground potential. The voltage or current increases exponentially to a peak value and then takes a dip because the field has moved the solenoid armature thereby increasing the solenoid inductance and inducing a negative rate of change of current per unit time (di/dt). After reaching the bottom of the dip, or valley, the voltage or current waveform then increases again to a steady state value above the value of the previous peak.

Figure 1:
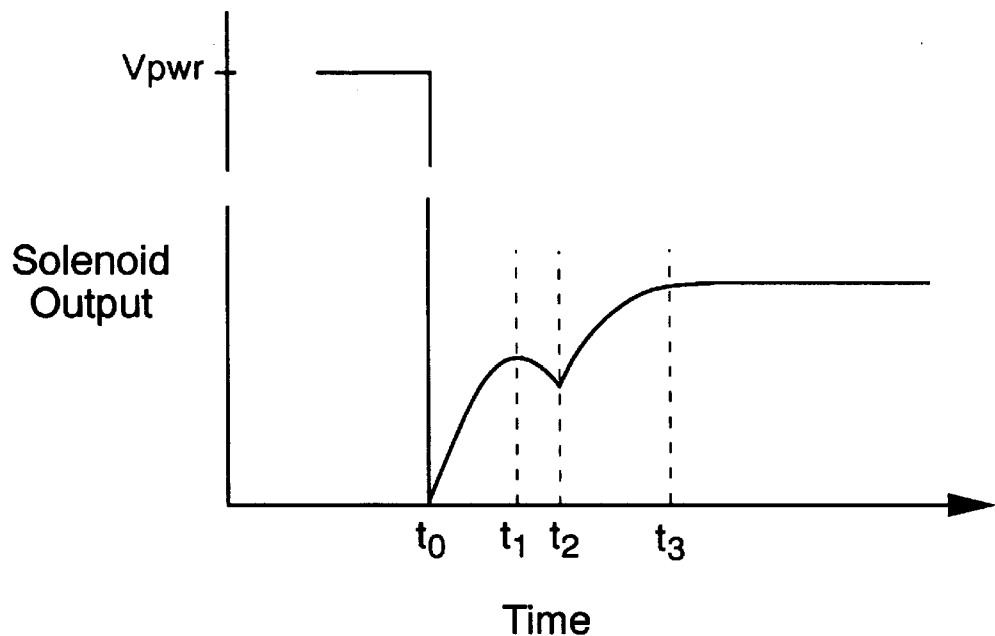
FIG. 1 illustrates a waveform of a typical valid solenoid signature plotted as voltage versus time for a low-sided driver configuration.
Figure 2:
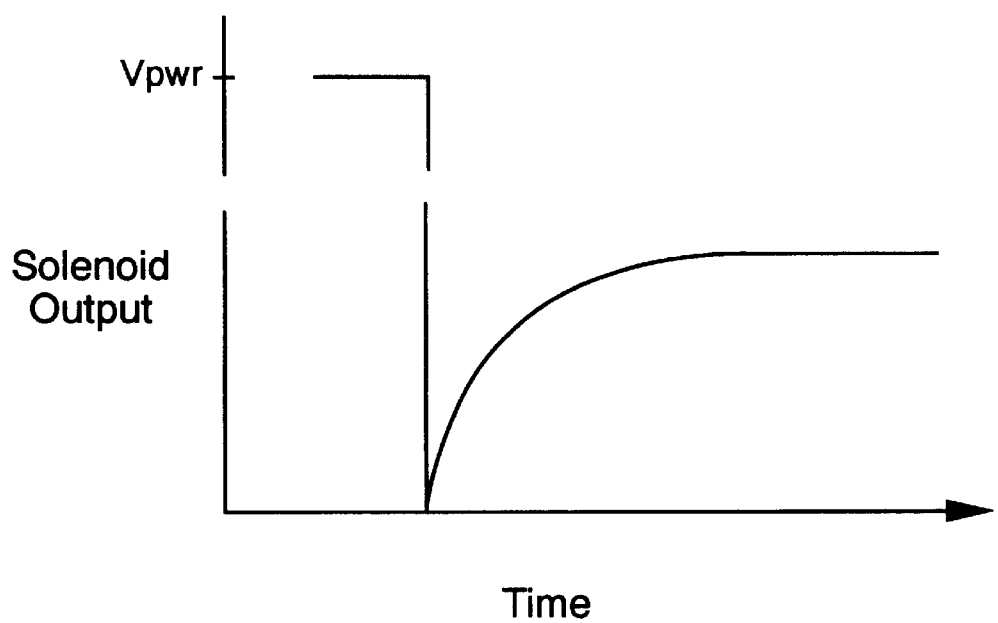
FIG. 2 illustrates a waveform of a typical defective solenoid signature plotted as voltage versus time for a low-sided driver configuration.

A waveform of a typical valid solenoid signature for a low-sided driver configuration is shown in FIG. 1. A waveform of a typical signature of a defective solenoid in a low-sided driver configuration is shown in FIG. 2 where there is no dip in the voltage or current signal indicating that the field has not moved the solenoid armature.

Figure 3:
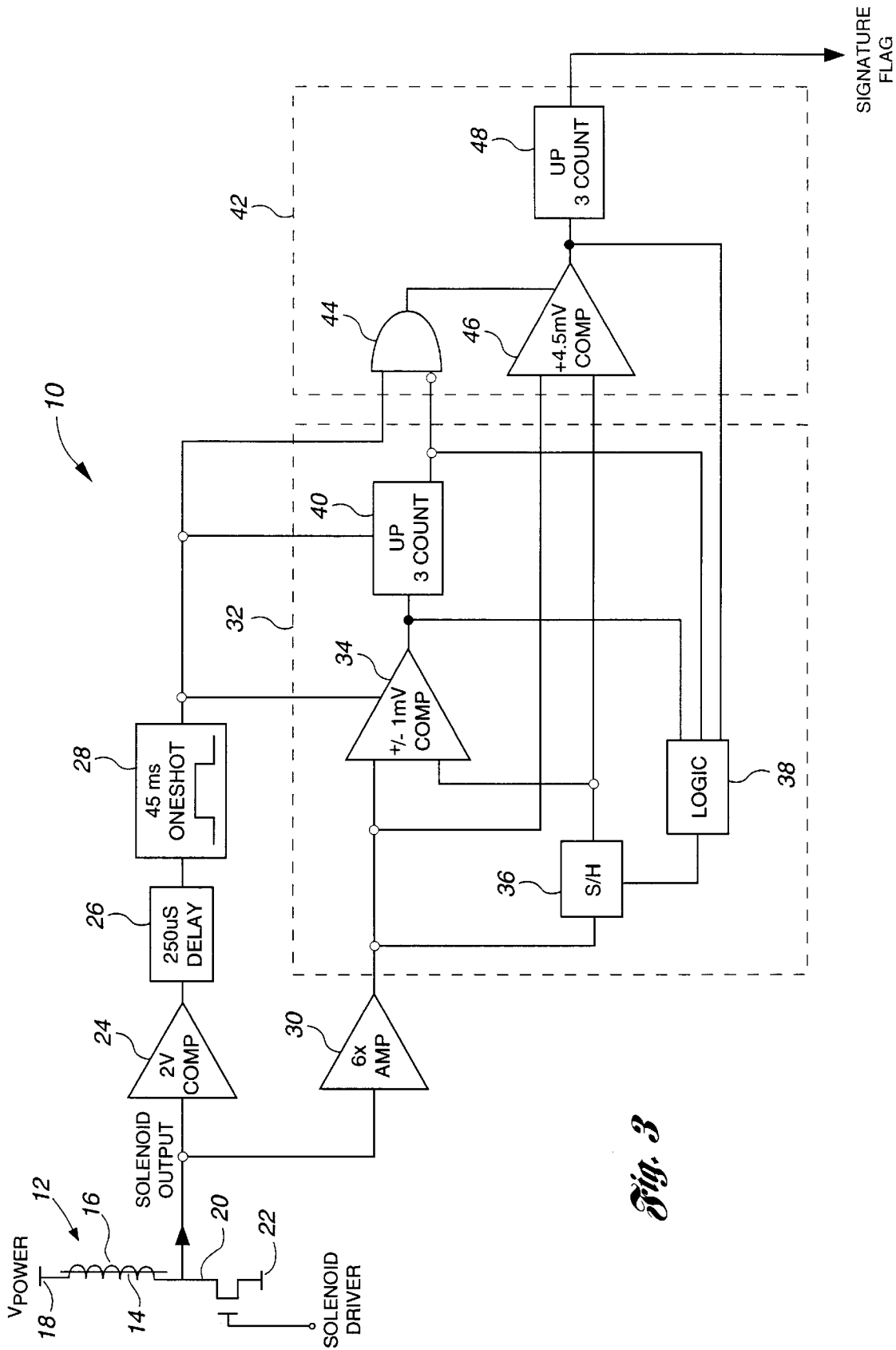
FIG. 3 is a block diagram of a detector circuit employed in the system of the present invention.

Turning now to FIG. 3, there is shown a block diagram of the detector circuit employed in the system of the present invention, denoted generally by reference numeral 10. A solenoid 12 includes an armature 14 that in turn is coupled to a mechanical device such as a gear or valve (not shown). A field coil 16 surrounds the armature 14 with one end coupled to a power supply 18 operating at a potential Vpower such as 12.0 volts output potential from an automotive battery. The other end of the field coil 16 is coupled to the drain of a transistor 20 that receives a solenoid driver signal at its gate. The source of the transistor 20 is coupled to a ground potential 22. Alternatively, the transistor 20 may be replaced with a resistor and switching circuit (not shown) or any other suitable method of switching and current sensing. A high solenoid driver signal turns on the transistor 20 and causing a current flow (i) through the field coil 16. The current (i) develops a magnetic field that moves the armature 14.

In many applications, it is important to verify the proper displacement of the armature of the solenoid 12. For example, the computer control system in an automobile needs to know when the transmission shifts gears in order to adjust fuel supply and engine RPMs. When properly operating, the potential at the end of the field coil connected to the drain (hereinafter called the SOLENOID OUTPUT signal) of the transistor 20 immediately drops to a value near ground potential as shown at $t_0$ in FIG. 1. The SOLENOID OUTPUT signal increases exponentially to a first peak value at time $t_1$ and then takes a dip because the field has moved the armature thereby increasing the solenoid inductance and inducing a negative rate of change of current per unit time (di/dt). After reaching a bottom of the dip, as shown at time $t_2$, the SOLENOID OUTPUT signal increases again to a steady state value at time $t_3$.

The detector circuit 10 begins operation at the initial activation of transistor 20 and monitors the output potential to detect the first peak value, e.g., at time $t_1$. If the SOLENOID OUTPUT signal reaches a first peak followed by a dip that has at least a minimum duration followed by a predetermined rise after reaching the bottom of the dip, then the current through the field coil 16 exhibits the expected electrical behavior for the device and the solenoid 12 is considered working properly. Otherwise, the solenoid 12 is determined to be degraded because the current through the field coil 16 is not following the electrical behavior of a properly operating solenoid.

Referring again to FIG. 3, the detector circuit 10 will further be described. One skilled in the art should appreciate that the detector circuit 10 can be implemented either in hardware using discrete components or can be implemented with software using any processor. The detector circuit 10 of the present invention includes a 2 volt comparator 24 coupled to the solenoid 12 for determining when the solenoid 12 is turned on. Upon detecting the SOLENOID OUTPUT signal transitioning below 2 volts, the detector circuit 10 is activated.

The SOLENOID OUTPUT signal is sampled during a predetermined time period following a predetermined amount of delay so that the initial voltage drop at time $t_0$ is not included in the sampling time period. This is accomplished via a delay 26, such as a 250 µs delay, and a one-shot timer circuit 28, such as a 45 ms one-shot circuit. The detector circuit 10 further includes a buffer amplifier 30 coupled to the output of solenoid 12 to amplify and buffer the SOLENOID OUTPUT signal.

To detect the dip in the SOLENOID OUTPUT signal, including the bottom of the dip, the detector circuit 10 includes a dip bottom detection circuit 32 coupled to the one-shot circuit 28 and the output of the buffer amplifier 30. The dip bottom detection circuit 32 includes a comparator 34 for comparing a current value of the SOLENOID OUTPUT signal to a previous value of the SOLENOID OUTPUT signal to determine the direction of the waveform generated by the SOLENOID OUTPUT signal. Thus, the comparator 34 is used to determine when the SOLENOID OUTPUT signal is rising and falling. Preferably, the comparator 34 is a ±1 mV comparator.

The previous value of the SOLENOID OUTPUT signal is stored in a sample and hold circuit 36 which is also coupled to the buffer amplifier 30. A logic circuit 38 is coupled to the output of the comparator 34 and the input of the sample and hold circuit 36 for enabling the sample and hold circuit 36. As the SOLENOID OUTPUT signal rises, the sample and hold circuit 36 is repeatedly enabled so that a peak in the SOLENOID OUTPUT signal can be detected.

Once the peak of the SOLENOID OUTPUT signal has been found, the dip bottom detector circuit 32 begins looking for the dip by detecting a predetermined number of samples below the peak of the SOLENOID OUTPUT signal via the comparator 34. After detecting a negative change in the SOLENOID OUTPUT signal, an up counter flag 40 is set to true. After a predetermined number of samples below the peak of the SOLENOID OUTPUT signal have occurred, e.g., three, it is determined that the SOLENOID OUTPUT signal has transitioned into the "dip" portion of the waveform.

The output of the up counter flag 40 is also coupled to the logic circuit 38 to indicate that the dip in the SOLENOID OUTPUT signal has occurred. At this point, the logic circuit 38 continues to repeatedly enable the sample and hold circuit 36 until the SOLENOID OUTPUT signal begins to rise again and a rise comparator 46 detects a positive change in the SOLENOID OUTPUT signal, as discussed below. Thus, the circuit 10 of the present invention validates the dip after the first peak in the SOLENOID OUTPUT signal but then proceeds to find the bottom of the dip. A predetermined amount of increase in the SOLENOID OUTPUT signal is now detected.

Upon determining that the bottom of the dip has occurred, a post dip rise detection circuit 42 is enabled. The post dip rise detection circuit 42 is enabled via an AND gate 44 coupled to the one-shot circuit 28 and the output of the up counter 40 and the logic circuit 38. The AND gate 44 enables the rise comparator 46 which is coupled to the output of the buffer amplifier 30 and the output of the sample and hold circuit 36. The rise comparator 46 compares the current value of the SOLENOID OUTPUT signal with a previous value of the SOLENOID OUTPUT signal to determine if the SOLENOID OUTPUT signal has risen by a predetermined amount, e.g., 4.5 mV. A larger threshold for the post dip rise detection is utilized to improve noise immunity.

After detecting a rise, or positive change, in the SOLENOID OUTPUT signal, a second up counter flag 48 is set to true. After a predetermined number of positive changes in the SOLENOID OUTPUT signal have occurred, e.g., three, it is determined that the SOLENOID OUTPUT signal has risen by a sufficient amount to indicate a valid solenoid signature. The rise in the SOLENOID OUTPUT signal may occur over multiple samples since the circuit 10 is detecting amplitude changes rather than slope changes. Thus, the system of the present invention may be used with solenoids that exhibit various rates of change.

Figure 4A:
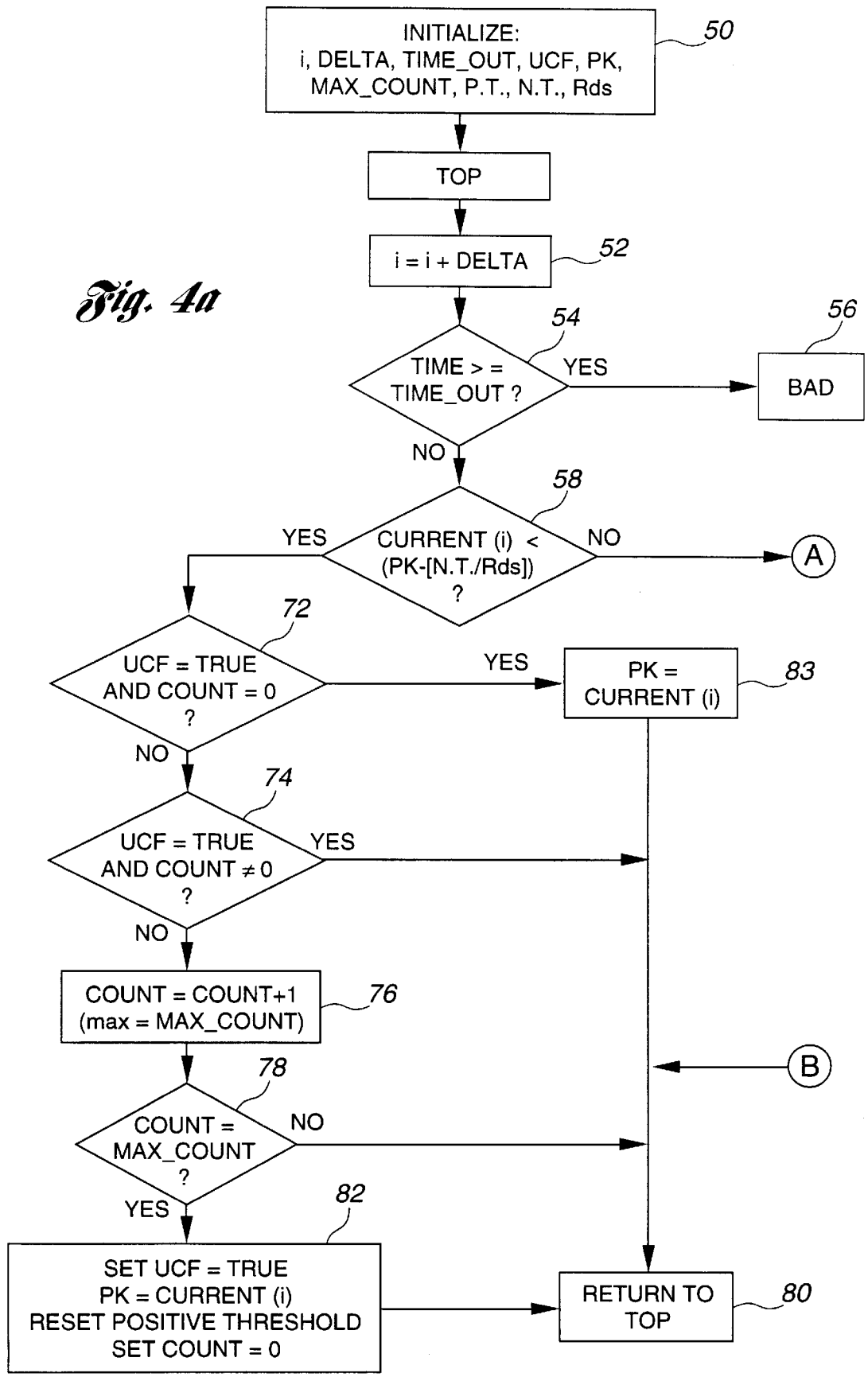
FIGS. 4a–4b is a flow diagram illustrating the general sequence of steps associated with the operation of the present invention.
Figure 4B:
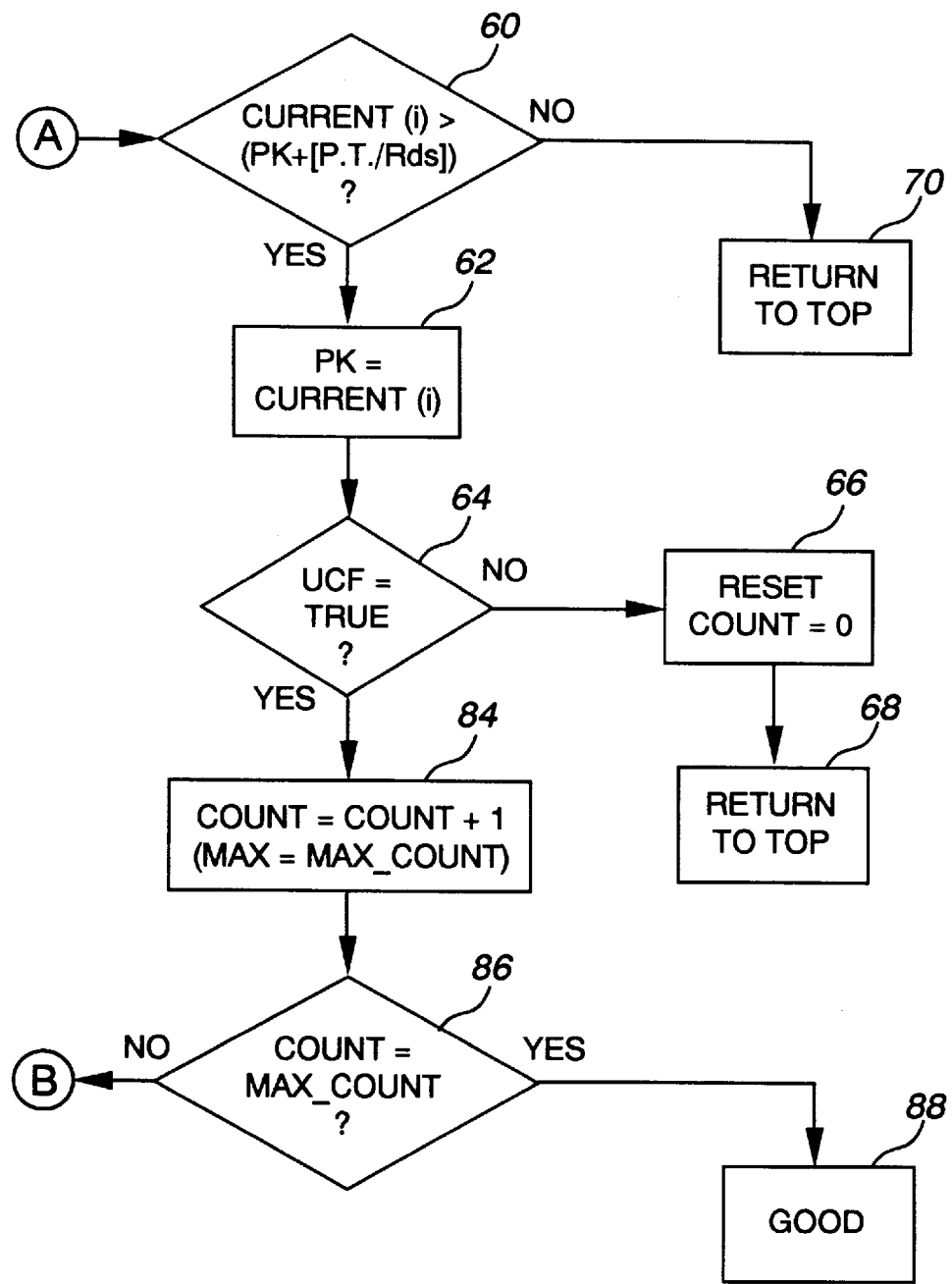

Turning now to FIGS. 4a–4b, there is shown a flow diagram illustrating the general sequence of steps associated with the operation of the present invention. The method begins with the step of initializing solenoid parameters, as shown at block 50. These parameters include i (time at which the method is operating), Delta (the amount of time between sample periods, e.g., 90 usec), TIME_OUT (the maximum pre-set period of time for which the method can run, e.g., 45 msec), UCF (a "flag" which is set when the method initially counts up to a maximum count), Peak (PK) (a value of current which the method "stores" for comparison purposes and for use in calculations), MAX_COUNT (a specified number of maximum counts, e.g., 3 counts), P.T. (a variable, positive voltage for comparison purposes), N.T. (a variable, negative voltage for comparison purposes) and Rds (the operating resistance of the transistor 20 which energizes the solenoid 12).

First, the method increments the time i by Delta, as shown at block 52, and compares the time to the maximum pre-set period of time, TIME_OUT, as shown at conditional block 54. If the current time exceeds TIME_OUT, an indication that the solenoid is not functioning properly is generated, as shown at block 56.

If the TIME_OUT has not been exceeded, the method continues to determine if there has been a decrease in the SOLENOID OUTPUT signal, as shown at conditional block 58. The current of the solenoid 12 at time i is compared to the negative threshold. At this point, the method is looking for the dip in the SOLENOID OUTPUT signal. Upon initialization, the current is increasing, so the method continues to determine if the current at time i exceeds the value PK+(P.T./Rds), as shown at conditional block 60. If so, the Peak (PK), or stored value, of current is replaced with the present value of the solenoid current, as shown at block 62. Thus, the method is detecting the initial ascent of the SOLENOID OUTPUT signal prior to the dip.

Next, a check is made to determine if the Up Count Flag (UCF) is set to true, as shown at conditional block 64. This flag is set when the method detects the solenoid current has decreased below a value PK—(N.T./Rds) for a predetermined number of counts. Since the solenoid 12 is still at the initial stage of the solenoid 12 actuation, the UCF is not true yet and the counter is reset, as shown at block 66. The method then returns to the top of the process, as shown at block 68. The method steps illustrated by blocks 52–54 and 58–68 are repeated until the peak of the SOLENOID OUTPUT signal is reached.

Upon nearing the peak of the SOLENOID OUTPUT signal, the current value of the solenoid current will not exceed the negative threshold or the positive threshold, and the method will return to the top of the process, as shown at block 70, and repeat blocks 52–54 and 58–70 until the SOLENOID OUTPUT signal exceeds the negative threshold signifying its descent into the dip portion of the waveform.

Once the SOLENOID OUTPUT signal begins descending, block 58 will be true and the method proceeds to determine if the UCF is true and the counter is equal to zero, as shown at conditional block 72. Since the current has not stayed below the peak for a predetermined number of samples, the method proceeds to determine if the UCF is true and the count is not equal to zero, as shown at conditional block 74. Again, the current has not stayed below the peak for a predetermined number of samples, therefore, the method continues to increment the counter, as shown at block 76.

The value of the counter is then compared with the maximum count value, MAX_COUNT, as shown at conditional block 78. If the predetermined number of samples have not been detected yet, the method returns to the top of the process, as shown at block 80. The method steps illustrated by blocks 52–54, 58, and 72–80 are repeated until the maximum number of voltage decreases, i.e., three, have been detected.

Once the counter has reached the MAX_COUNT, the UCF is set to true, the stored value, PK, of the solenoid current is replaced with the present value of the solenoid current, the positive threshold is reset to a larger value, e.g., from 1.0 mV to 4.5 mV, and the counter is reset to zero, as shown at block 82. A dip in the SOLENOID OUTPUT signal has now been detected for a minimum duration.

Once the characteristic dip has been found, the method continues to search for the bottom of the dip. Blocks 58 and 72 will be true as long as the SOLENOID OUTPUT signal is decreasing, and the stored value, PK, of the solenoid current is repeatedly replaced with the current value of the solenoid current, as shown at block 83, until the SOLENOID OUTPUT signal begins to rise again.

The stored value, PK, of the solenoid current will represent the value of the solenoid current at the bottom of the dip when block 58 is false. Block 60 will be true when the current increase exceeds the positive threshold (PK+(P.T./Rds)) and blocks 62 and 64 are executed. At block 64, the UCF is true and the method continues to increment the counter, as shown at block 84. The value of the counter is then compared with the MAX_COUNT, as shown at conditional block 86. The SOLENOID OUTPUT signal is not validated until a minimum number of voltage increases have followed the bottom of the dip. Therefore, method steps outlined in blocks 52–54, 58–64, 84–86 and 80 are repeated until the counter reaches the MAX_COUNT. At this time, a signal is provided indicating that the solenoid 12 has exhibited a valid electrical signature, as shown at block 88.

The method of the present invention provides immunity to system noise at block 74 when a dip in the SOLENOID OUTPUT signal is detected while the SOLENOID OUTPUT signal is rising from the bottom of the dip. If the UCF is true and the counter is not equal to zero, the method simply returns to the beginning of the process without incrementing any counters or resetting any flags.

The method and system of the present invention is generic and can be used on all types of solenoids. Changes in operating conditions and mechanical variances which cause solenoid signature changes do not have an effect on the method and system of the present invention. Thus, test time, calibration time, expenses and complexity are reduced.

While the best modes for carrying out the invention have been described in detail, those familiar with the art to which this invention relates will recognize various alternative designs and embodiments for practicing the invention as defined by the following claims.

What is claimed is:

1. A method for verifying operation of a solenoid generating an output signal having a predetermined waveform, the solenoid being one of a plurality of solenoids that generate varying output signals, the method comprising:

sampling the output signal of the solenoid at predetermined time intervals;

detecting a maximum value of the sampled output signal;

detecting a minimum value of the sampled output signal subsequent to the detection of the maximum value; and detecting a predetermined in crease in the sampled output signal subsequent to the detected minimum value so as to verify operation of the solenoid.

2. The method as recited in claim 1 wherein detecting the maximum value includes:

(a) comparing the sampled output signal to a peak signal to determine when the output signal is increasing by a first predetermined amount, the peak signal representing the output signal sampled during a previous time interval;

(b) storing the sampled out-out signal as said peak signal when the output signal increases by the first predetermined amount; and (c) repeating steps (a) and (b) until the sampled output signal begins to decrease by an amount greater than the first predetermined amount.

3. The method as recited in claim 2 wherein detecting the minimum value includes:

(d) comparing the sampled output signal to said peak signal to determine when the output signal is decreasing by the first predetermined amount;

(e) storing the sampled output signal as said peak signal when the sampled output signal decreases by the first predetermined amount; and (f) repeating steps (d) and (e) until the sampled output signal begins to increase by an amount greater than a second predetermined amount.

4. The method as recited in claim 3 wherein the step of comparing the sampled output signal to determine when the output signal is decreasing by the first predetermined amount includes detecting a predetermined number of sampled output signals being less than the peak signal.

5. The method as recited in claim 4 wherein detecting the predetermined increase includes comparing the sampled output signal to the peak signal to determine the sampled output signal is increasing by said second predetermined amount.

6. The method as recited in claim 1 further comprising determining the operation of the solenoid is degraded if detecting the maximum value, detecting the minimum value and detecting the predetermined increase are not completed within a predetermined period of time.

7. A system for verifying operation of a solenoid generating an output signal having a predetermined waveform, the solenoid being one of a plurality of solenoids that generate varying output waveforms, the system comprising:

means for sampling the output signal of the solenoid at predetermined time intervals to generate corresponding sampled output signals;

means for detecting a maximum value of the sampled output signals;

means for detecting a minimum value of the sampled output signals subsequent to the detection of the maximum value; and means for detecting a predetermined increase in the sampled output signals subsequent to the detected minimum value so as to verify proper operation of the solenoid.

8. The system as recited in claim 7 wherein the means for detecting the maximum value includes:

a first comparator for comparing each of the sampled output signals to a peak signal to determine when the sampled output signals are increasing by a first predetermined amount, the peak signal representing the output signal sampled during a previous time interval;

means for storing the sampled output signal as the peak signal when the output signal increases by the first predetermined amount; and means for repeatedly comparing each of the sampled output signals to the peak signal until the sampled output signals begin to decrease by an amount greater than the first predetermined amount.

9. The system as recited in claim 8 wherein the means for detecting the minimum value includes:

a second comparator for comparing each of the sampled output signals to the peak signal to determine when the sampled output signals are decreasing by the first predetermined amount;

means for storing the sampled output signal as the peak signal when the sampled output signal decreases by the first predetermined amount; and means for repeatedly comparing the sampled output signals to the peak signal until the sampled output signals begin to increase by an amount greater than a second predetermined amount.

10. The system as recited in claim 9 further comprising means for detecting a predetermined number of sampled output signals being less than the peak signal.

11. The system as recited in claim 10 wherein the means for detecting the predetermined increase includes the second comparator for comparing each of the sampled output signals to the peak signal to determine when the sampled output signals are increasing by the second predetermined amount.

12. The system of claim 7 further comprising means for signifying improper operation of the solenoid when the means for detecting the maximum value, the means for detecting the minimum value and the means for detecting the predetermined increase fail to find the maximum value, the minimum value and the predetermined increase, respectively, within a predetermined period of time.

* * * * *